(12) United States Patent
Yu et al.

(10) Patent No.: US 11,658,084 B2
(45) Date of Patent: May 23, 2023

(54) SEMICONDUCTOR PACKAGING STRUCTURE

(71) Applicant: Powertech Technology Inc., Hsinchu (TW)

(72) Inventors: Shun-Ming Yu, Hsinchu (TW); Han-Ming Chu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 85 days.

(21) Appl. No.: 17/318,066

(22) Filed: May 12, 2021

(65) Prior Publication Data
US 2022/0102232 A1    Mar. 31, 2022

(30) Foreign Application Priority Data

Sep. 29, 2020   (TW) .................................. 109133790

(51) Int. Cl.
*H01L 23/31*    (2006.01)
*H01L 21/56*    (2006.01)

(52) U.S. Cl.
CPC ........ *H01L 23/3121* (2013.01); *H01L 21/565* (2013.01)

(58) Field of Classification Search
CPC ............. H01L 23/3107; H01L 23/4951; H01L 23/49558; H01L 23/59586; H01L 23/3121; H01L 21/565
See application file for complete search history.

(56) References Cited

U.S. PATENT DOCUMENTS

| 2005/0155792 A1* | 7/2005 | Ito ........................ H05K 3/4617 29/852 |
| 2010/0327454 A1* | 12/2010 | Yamaguchi ........... H01L 23/544 257/E23.06 |

FOREIGN PATENT DOCUMENTS

| TW | 471145 B | 1/2002 | |
| WO | WO-0079588 A1 * | 12/2000 | ......... H01L 21/4832 |

OTHER PUBLICATIONS

English machine translation of WO 20000/79588 Umeda et al. (Year: 2000).*
Search Report appended to an Office Action, which was issued to Taiwanese counterpart application No. 109133790 by the TIPO dated Dec. 31, 2020, with an English translation thereof.

* cited by examiner

*Primary Examiner* — Jaehwan Oh
*Assistant Examiner* — John M Parker
(74) *Attorney, Agent, or Firm* — Burris Law, PLLC

(57) ABSTRACT

A semiconductor packaging structure includes a substrate, a wiring layer, a mask layer, and a sealing layer. The substrate has an effective region and a dummy region surrounding the effective region. The wiring layer is disposed on the effective and dummy regions, and is formed with a predetermined pattern including spaced-apart protrusions to define at least one cavity partially exposing the dummy region. The mask layer covers the wiring layer, and is formed with a through hole to communicate in space with the cavity. The through hole is smaller in size than the cavity, and cooperates with the cavity to form an accommodating space. The sealing layer covers the mask layer, and includes an engaging element filling the accommodating space and adhering to the substrate.

20 Claims, 14 Drawing Sheets

US 11,658,084 B2

SEMICONDUCTOR PACKAGING STRUCTURE

CROSS-REFERENCE TO RELATED APPLICATION

This application claims priority of Taiwanese Invention Patent Application No. 109133790, filed on Sep. 29, 2020.

FIELD

The disclosure relates to a semiconductor packaging structure, and more particularly to a semiconductor packaging structure with improved sealability.

BACKGROUND

In electronics industry, electronic components such as capacitors, inductors, and resistors are usually packaged using a ceramic gel or a plastic gel, e.g., an epoxy molding compound (EMC) resin, so as to prevent wiring of the electronic components from contacting with external air and moisture which might result in a decreased conductivity of the wiring.

Referring to FIGS. 1 and 2, a conventional semiconductor packaging structure 1 includes a substrate 11 having an effective region 111, a wiring layer 12 disposed on the effective region 111 of the substrate 11, a solder mask layer 13 disposed on the wiring layer 12 opposite to the substrate 11, and a sealing layer 14 that encapsulates the wiring layer 12 and the solder mask layer 13 and that covers the effective region 111. A circuit and an electronic component to be packaged (not shown in the figures) that is electrically connected to the circuit are configured to be disposed within the effective region 111 of the substrate 11. The solder mask layer 13 having an insulating function is used to prevent shortcut of the electronic component. The electronic component is electrically connected to the wiring layer 12 through bonding wires (not shown in the figures).

The sealing layer 14 is configured to prevent the wiring layer 12, the circuit and the electronic component from being in contact with external air and moisture. However, as shown in FIG. 3, a portion of the sealing layer 14 that is disposed on a peripheral portion of the effective region 111 might be easily detached from the substrate 11, resulting in a poor adhesion therebetween, thereby reducing sealability of the conventional semiconductor packaging structure 1.

In order to improve the sealability of the conventional semiconductor packaging structure, before the sealing layer 14 is applied, the substrate 11, the wiring layer 12, and the solder mask layer 13 are subjected to a plasma cleaning treatment to remove impurities and contaminants. However, such plasma cleaning treatment is required to be implemented in a vacuum environment using vacuum equipments, resulting in an increased packaging cost.

Therefore, there is a need to develop a semiconductor packaging structure which has an improved sealability and which can be manufactured in a cost-saving manner.

SUMMARY

An object of the disclosure is to provide a semiconductor packaging structure that can alleviate at least one of the drawbacks of the prior art.

According to the disclosure, the semiconductor packaging structure includes a substrate, a wiring layer, a mask layer, and a sealing layer.

The substrate has an effective region and a dummy region surrounding the effective region.

The wiring layer is disposed on the effective region and the dummy region of the substrate, and is formed with a predetermined pattern to expose a portion of the dummy region. The predetermined pattern includes a plurality of protrusions that extend toward each other and that are spaced apart from each other to define at least one cavity that exposes a portion of the dummy region.

The mask layer covers the wiring layer opposite to the substrate, and is formed with at least one through hole to communicate in space with the cavity. The through hole has a size that is smaller than a size of the cavity. The through hole and the cavity cooperate to form an accommodating space.

The sealing layer covers the mask layer and includes an engaging element filling the accommodating space and adhering to the substrate.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
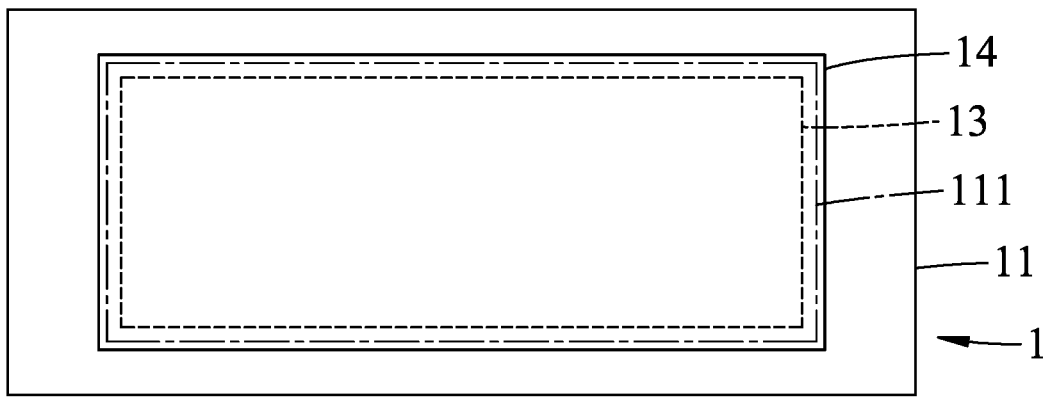
FIG. 1 is a schematic top view illustrating a conventional semiconductor packaging structure.
Figure 2:
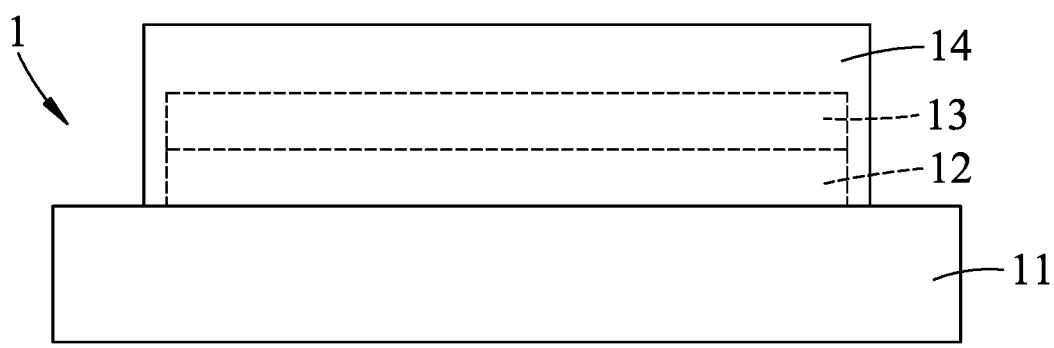
FIG. 2 is a schematic side view illustrating the conventional semiconductor packaging structure.
Figure 3:
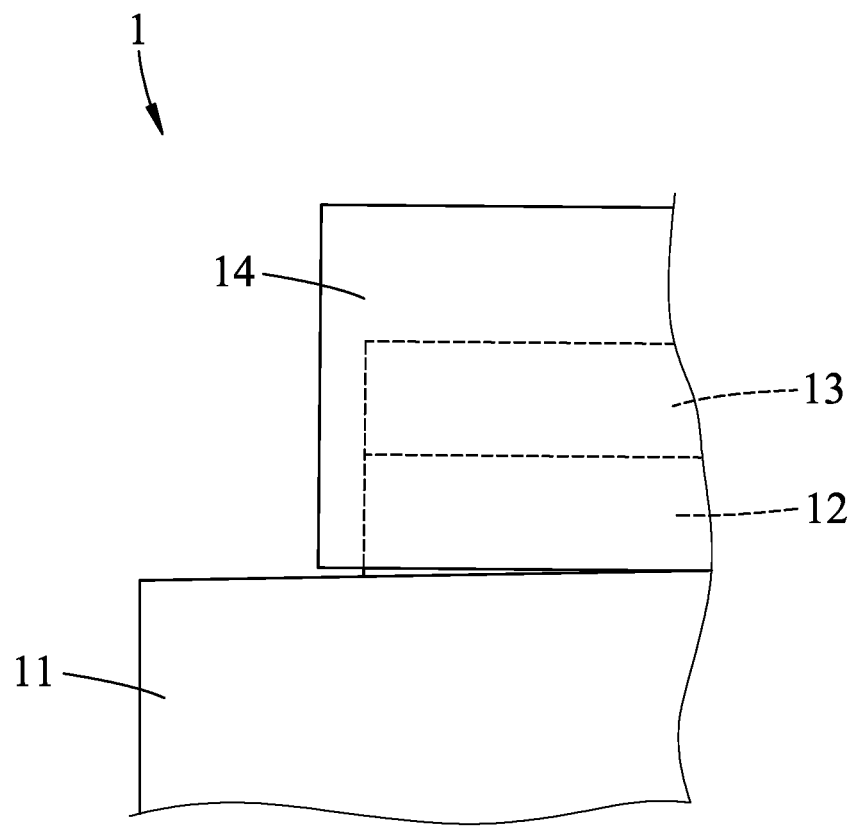
FIG. 3 is a partially enlarged view of FIG. 2, illustrating poor adhesion between a sealing layer and a substrate of the conventional semiconductor packaging structure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 4:
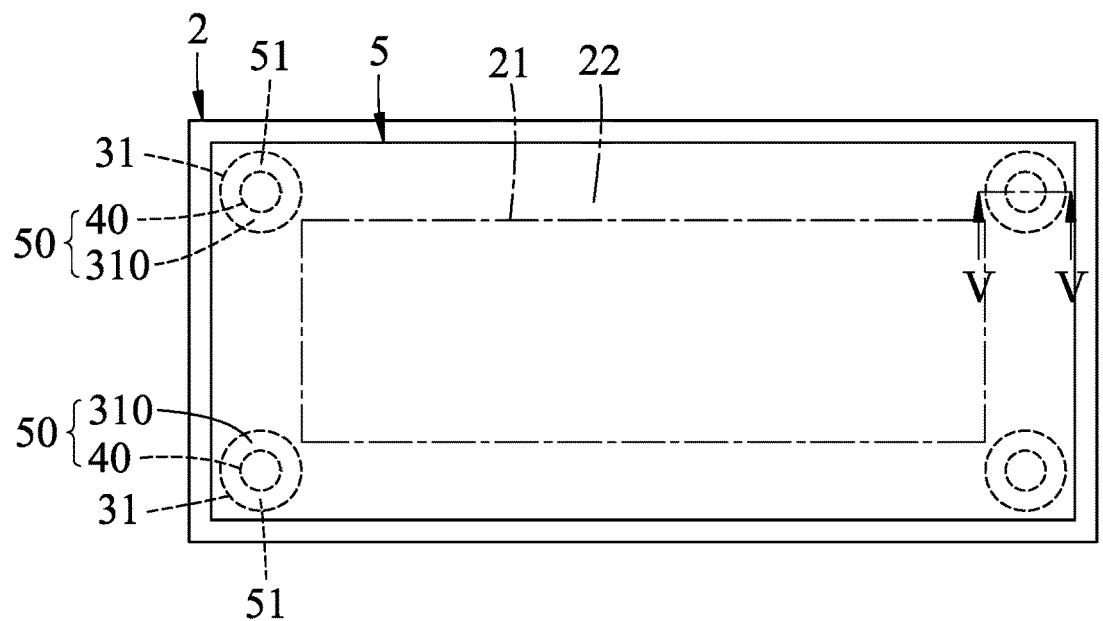
FIG. 4 is a schematic top view illustrating a first embodiment of a semiconductor packaging structure according to the disclosure.
Figure 5:
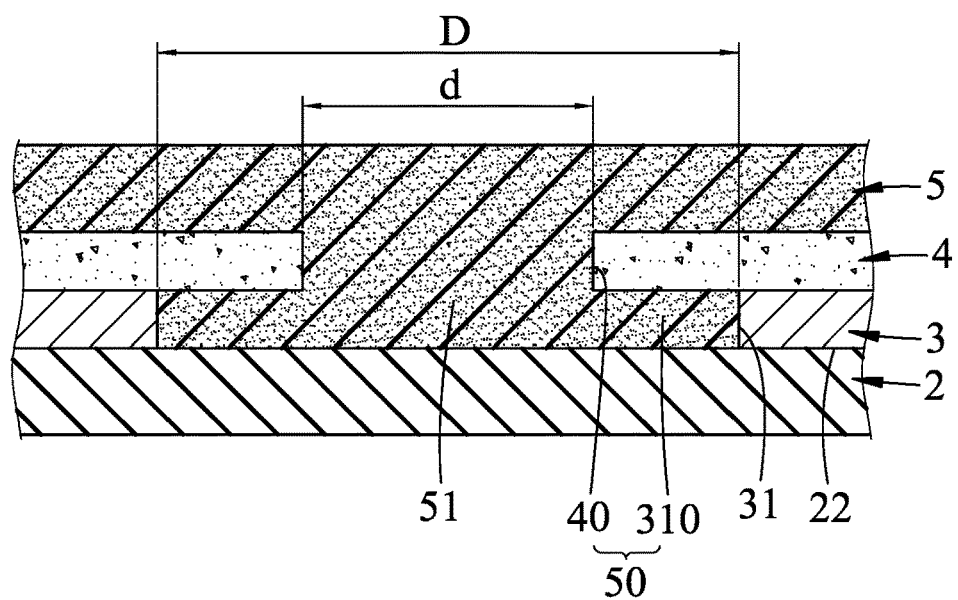
FIG. 5 is a cross-sectional view taken along line V-V of FIG. 4.

Referring to FIGS. 4 and 5, a first embodiment of a semiconductor packaging structure according to the present disclosure includes a substrate 2, a wiring layer 3, a mask layer 4, and a sealing layer 5.

The substrate 2 has an effective region 21 and a dummy region 22 surrounding the effective region 21. A circuit and an electronic component (not shown in the figures) to be packaged in the semiconductor packaging structure are mounted within the effective region 21. The electronic component is electrically connected to the circuit. It should be noted that, the "effective region" refers to a region for forming the circuit and the electronic component, and the "dummy region" refers to a region without any functional circuit or electronic component disposed thereon. In this embodiment, the substrate 2 is a circuit board.

The wiring layer 3 is disposed on the effective region 21 and the dummy region 22 of the substrate 2, and is formed with a predetermined pattern 31 to expose a portion of the dummy region 22 and to define at least one cavity 310. The wiring layer 3 may be made of copper (Cu) and may have a thickness ranging from 10 μm to 30 μm. A cross section of a wall defining the cavity 310 may be in any shape such as a rectangular shape, an elliptical shape, an irregular shape, etc. In this embodiment, the cross section of the wall defining the cavity 310 is in a circle shape. The cavity 310 may be an undercut structure formed by an etching process, which will be described in details below.

The mask layer 4 covers the wiring layer 3 opposite to the substrate 2, and is formed with at least one through hole 40 to communicate in space with the cavity 310. The through hole 40 has a size (d) that is smaller than a size (D) of the cavity 310. The through hole 40 and the cavity 310 cooperate to form an accommodating space 50.

In certain embodiments, the predetermined pattern 31 defines a plurality of the cavities 310, and the mask layer 4 is formed with a plurality of the through holes to respectively communicate in space with the cavities 310. The number of the through holes 40 may be identical to the number of the cavities 310. The cavities 310 may be spacedly located on a peripheral portion of the dummy region 22.

The sealing layer 5 covers the mask layer 4, and includes an engaging element 51 filling the accommodating space 50 and adhering to the substrate 2. That is, the engaging element 51 has a shape complementary to that of the accommodating space 50. There are no particular limitations on the configuration of the sealing layer 5. In this embodiment, the sealing layer 5 has a rectangular shape.

In this embodiment, the predetermined pattern 31 defines four cavities 310, and the mask layer 4 is formed with four through holes 40. The four cavities 310 are respectively located at the corners of the dummy region 22. Each of the cavities 310 and a respective one of the through holes 40 cooperate to forma corresponding one of the engaging elements 51 that are in a shape of an inverted stud. A difference between the size (D) of each of the cavities 310 and the size (d) of the respective one of the through holes 40 of the mask layer 4 may range from 500 μm to 100 μm, so as to ensure a sufficient engagement of the engaging elements 51. The size (d) of each of the through holes (40) may range from 100 μm to 500 μm, e.g., 100 μm in this embodiment.

By virtue of each of the engaging elements 51 of the sealing layer 5 filling a respective one of the accommodating spaces 50 and adhering to the substrate 2, an adhesion between the sealing layer 5 and the substrate 2 can be increased, so as to improve the sealability of the semiconductor packaging structure.

Referring to FIGS. 6 to 11, a first embodiment of a packaging method for making the first embodiment of the semiconductor packaging structure according to the disclosure includes the following consecutive steps S1 to S5.

Figure 6:
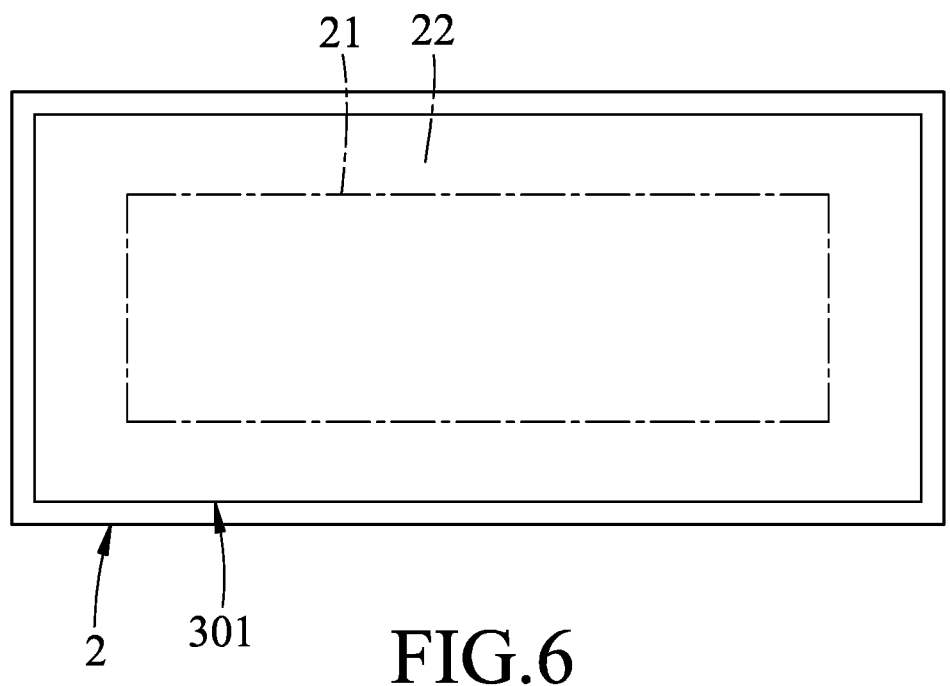
FIGS. 6 to 9 are schematic top views illustrating steps S1 to S4 of a first embodiment of a packaging method for making the first embodiment of the semiconductor packaging structure according to the disclosure.

In step S1, as shown in FIG. 6, a conductive layer 301 is disposed on the effective region 21 and the dummy region 22 of the substrate 2. The conductive layer 301 is made of Cu.

Figure 7:
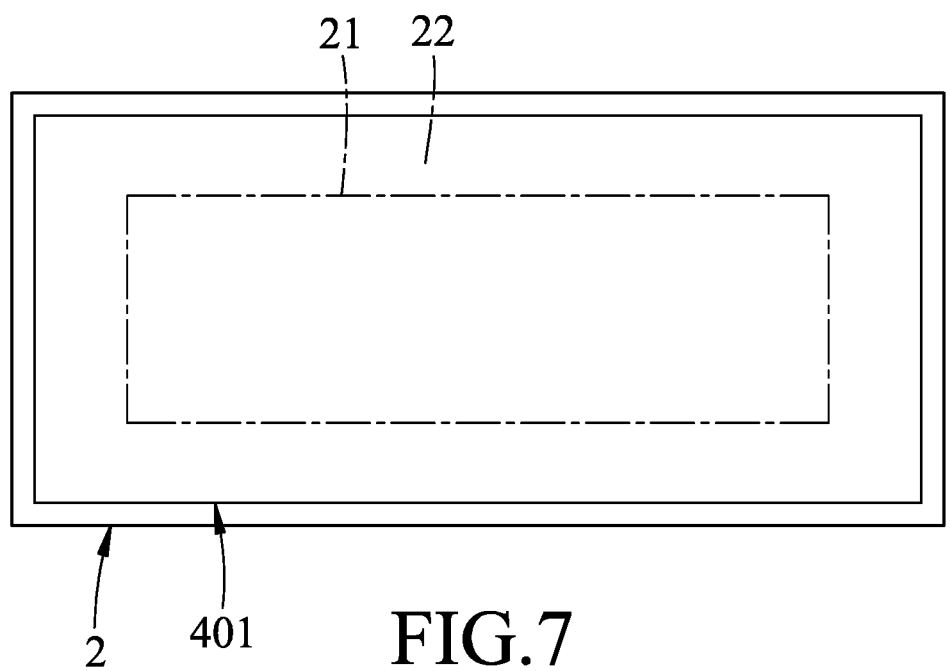

In step S2, as shown in FIG. 7, a photoresist layer 401 is disposed on the conductive layer 301 opposite to the substrate 2.

Figure 8:
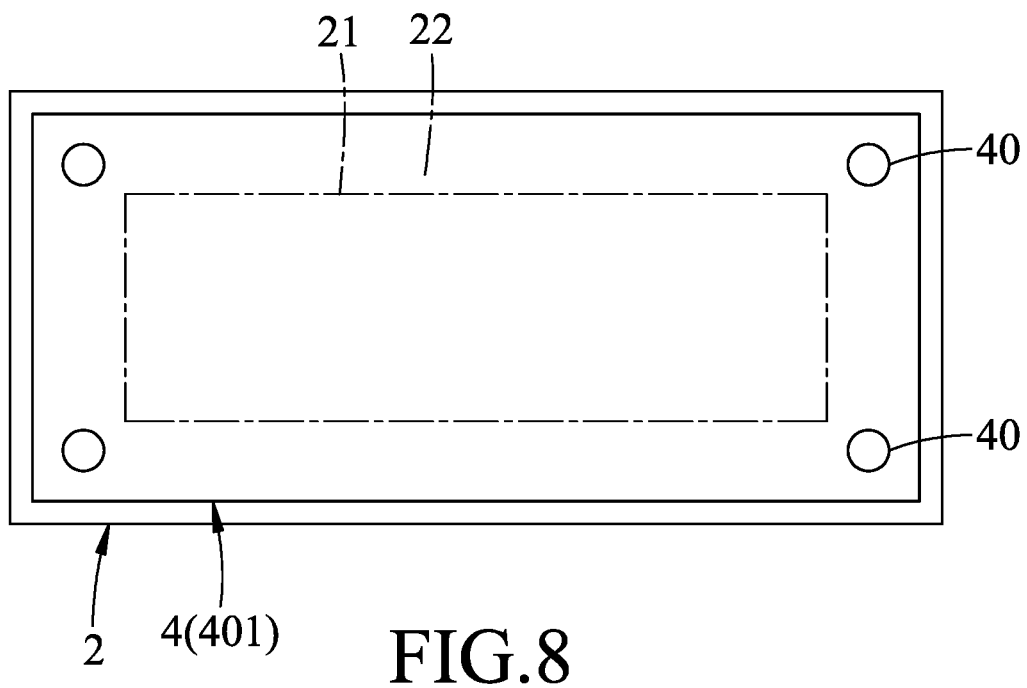

In step S3, as shown in FIG. 8, at least one predetermined area of the photoresist layer 401 is subjected to a photolithography process (i.e., light-exposure and development), so as to form at least one through hole 40 that exposes the conductive layer 301. In this embodiment, four predetermined areas of the photoresist layer 401 that are spacedly located on the peripheral portion of the dummy region 22 (such as the corners of the dummy region 22 having a cross-section in a rectanglar shape) are subjected to the photolithography process, such that the mask layer 4 is formed with four through holes 40. Each of the four through holes 40 is located at a respective one of the four predetermined areas.

Figure 9:
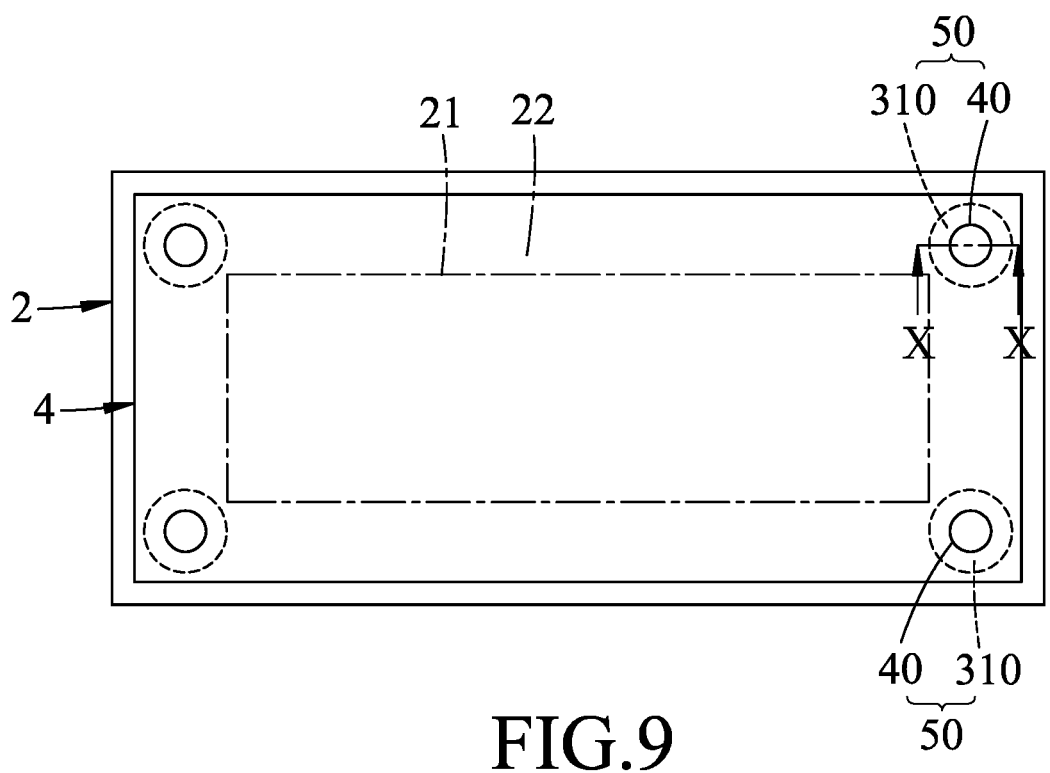
Figure 10:
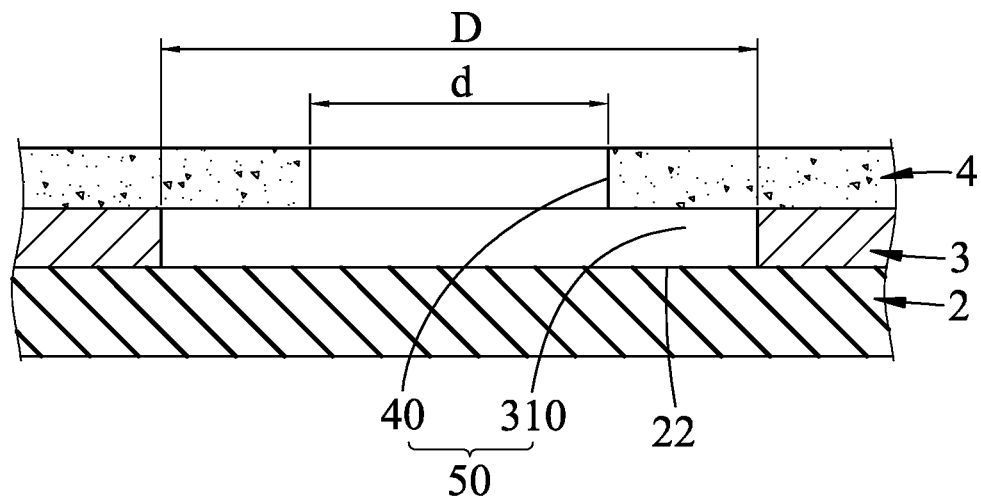
FIG. 10 is a cross-sectional view taken along line X-X of FIG. 9.

In step S4, as shown in FIGS. 9 and 10, the exposed conductive layer 301 is subjected to an isotropic etching process via the through holes 40, so as to obtain the wiring layer 3 formed with four cavities 310, each exposing a portion of the dummy region 22 of the substrate 2. It is noted that the isotropic etching process is performed within the conductive layer 301 in multiple directions, resulting in undercutting of the conductive layer 301, thereby forming the cavities 310, each of which has a size (D) greater than the size (d) of a respective one of the through holes 40. Each of the four cavities 310 (i.e., an undercut structure) and a respective one of the four through holes 40 cooperate to form the accommodating space 50. The isotropic etching process may be a wet etching process which is performed using an etchant so as to etch Cu of the conductive layer 301.

Figure 11:
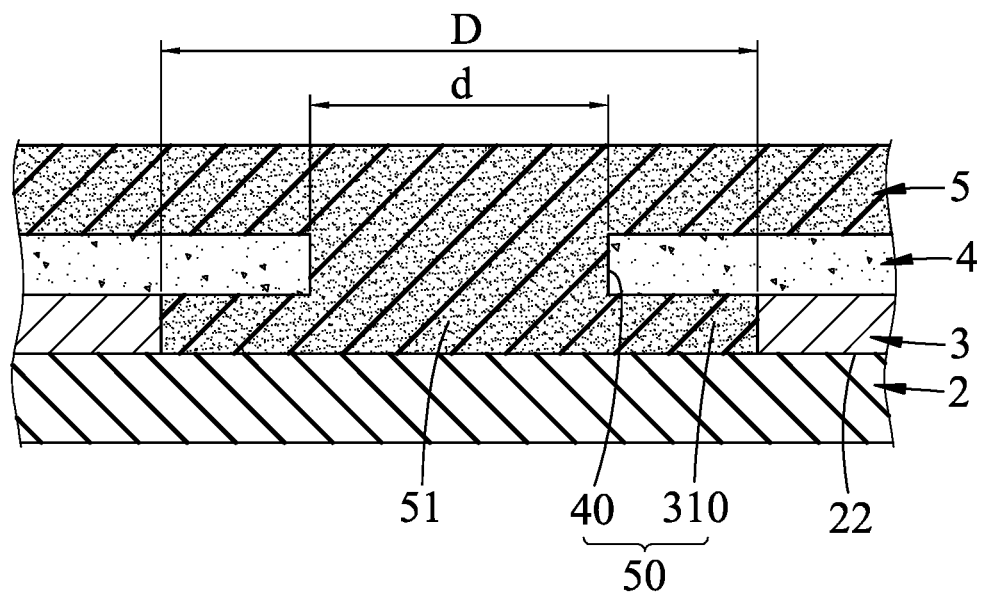
FIG. 11 is a cross-sectional view illustrating step S5 of the first embodiment of the packaging method.

In step S5, as shown in FIG. 11, the sealing layer 5 is applied to cover the mask layer 4, and to form the engaging elements 51 filling the accommodating space 50 and adhering to the substrate 2.

By virtue of forming the accommodating space 50 that exposes the dummy region 22 of the substrate 2 via the photolithography process and the isotropic etching process, and by virtue of forming the engaging elements 51 that fill the accommodating space 50 and that adhere to the substrate 2, an adhesion between the sealing layer 5 and the substrate 2 can be increased, so as to improve the sealability of the semiconductor packaging structure. Compared with the conventional semiconductor packaging structure that requires the plasma cleaning treatment to be performed during packaging, thereby incurring a high manufacturing cost, the semiconductor packaging structure of this disclosure can be made in a cost-saving manner.

Figure 12:
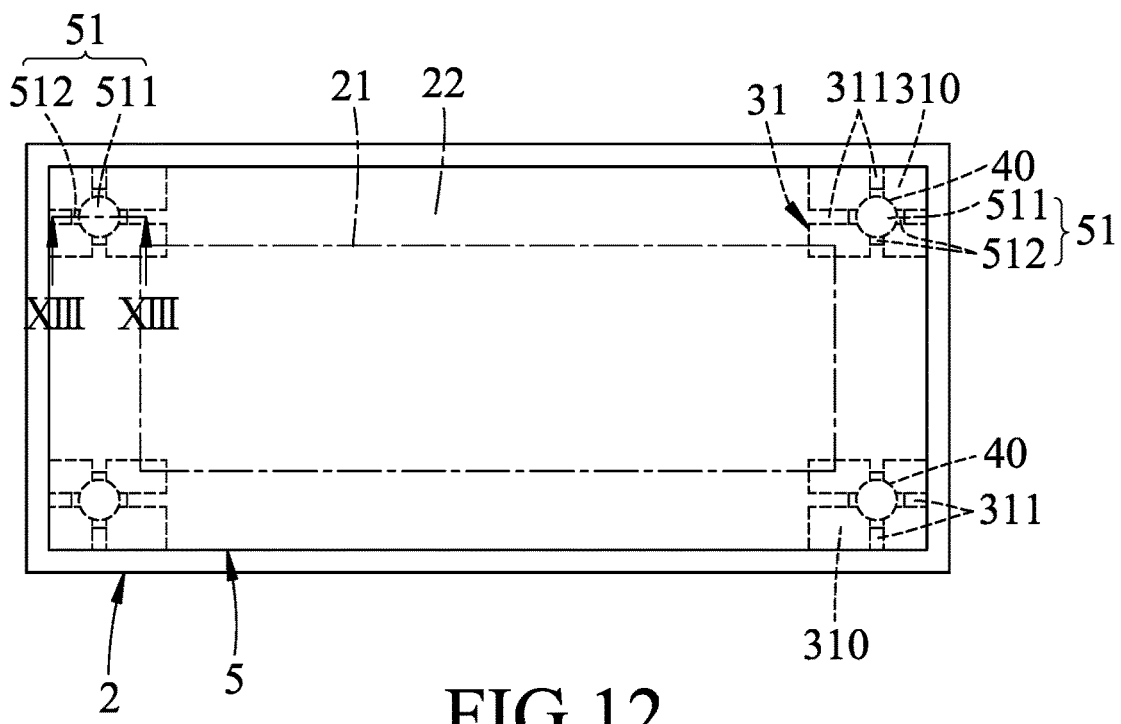
FIG. 12 is a schematic top view illustrating a second embodiment of the semiconductor packaging structure according to the disclosure.
Figure 13:
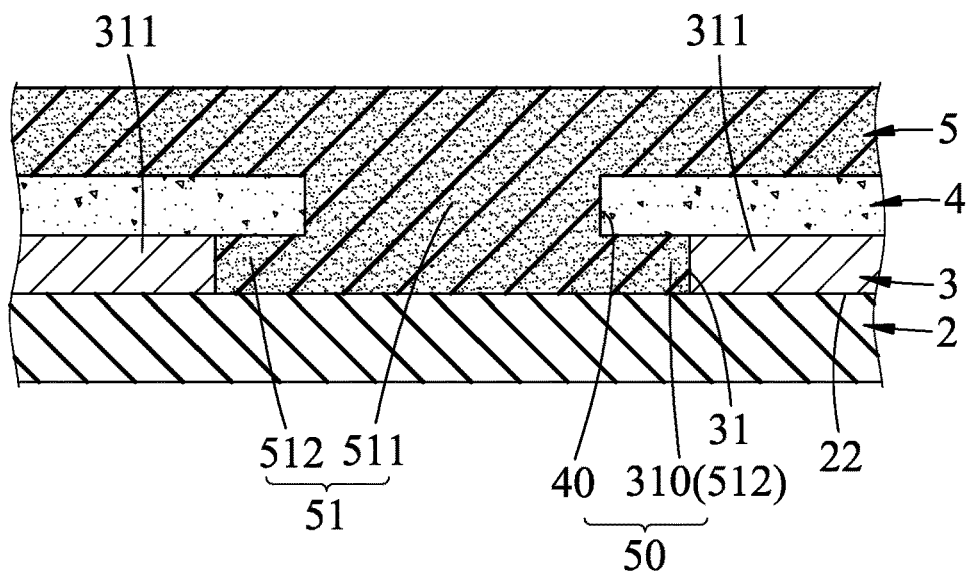
FIG. 13 is a cross-sectional view taken along line XIII-XIII of FIG. 12.

Referring to FIGS. 12 and 13, a second embodiment of the semiconductor packaging structure according to the present disclosure is generally similar to the first embodiment, except that in the second embodiment, for each of the cavities 310, the predetermined pattern 31 of the wiring layer 3 includes a plurality of protrusions 311 that extend toward each other and that are spaced apart from each other to define the cavity 310. In addition, each of the engaging elements 51 includes a shank part 511 extending from the through hole 40 to the substrate 2, and a plurality of engaging parts 512 contacting with the protrusions 311. Each of the engaging parts 512 radially extends from the shank part 511.

Referring to FIGS. 14 to 18, a second embodiment of the packaging method for making the second embodiment of the semiconductor packaging structure according to the present disclosure is generally similar to the first embodiment of the packaging method, except for the following differences.

Figure 14:
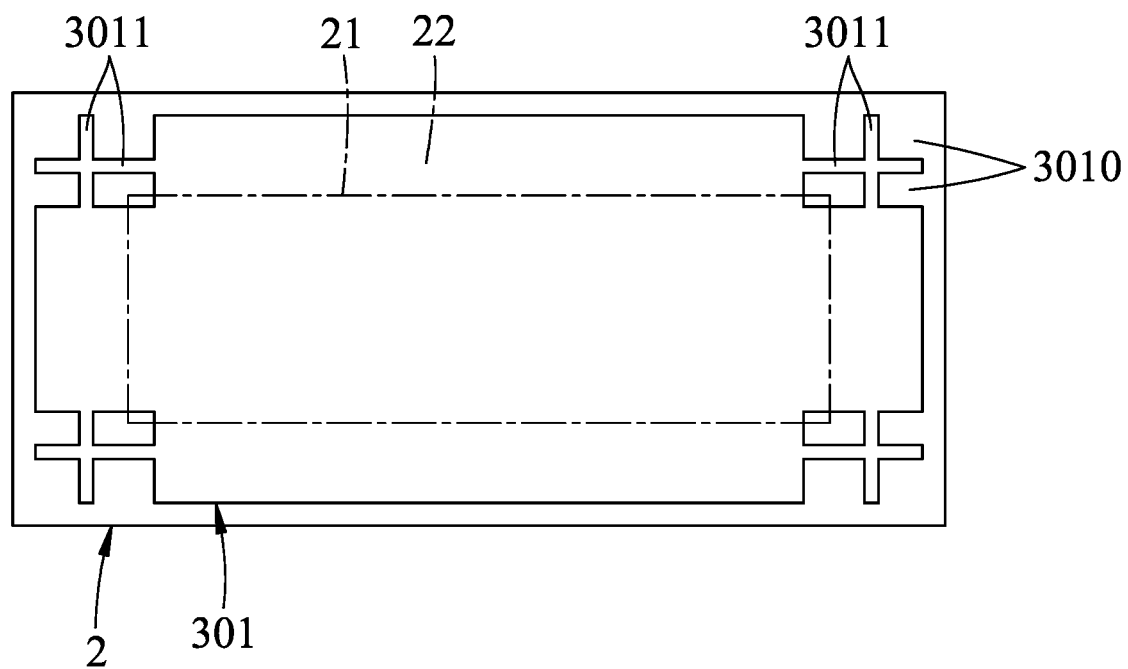
FIGS. 14 and 15 are schematic top views illustrating step S1 and S3 of a second embodiment of the packaging method for making the second embodiment of the semiconductor packaging structure.

In step S1, as shown in FIG. 14, the conductive layer 301 includes four first patterns, each of which is located at a respective one of the corners of the dummy region 22, and each of which has a cross-shaped strip 3011 to define a recess region 3010 that exposes the dummy region 22. Then, in step S2, the photoresist layer 401 is disposed on the conductive layer 301 opposite to the substrate 2, and fills the recess region 3010.

Figure 15:
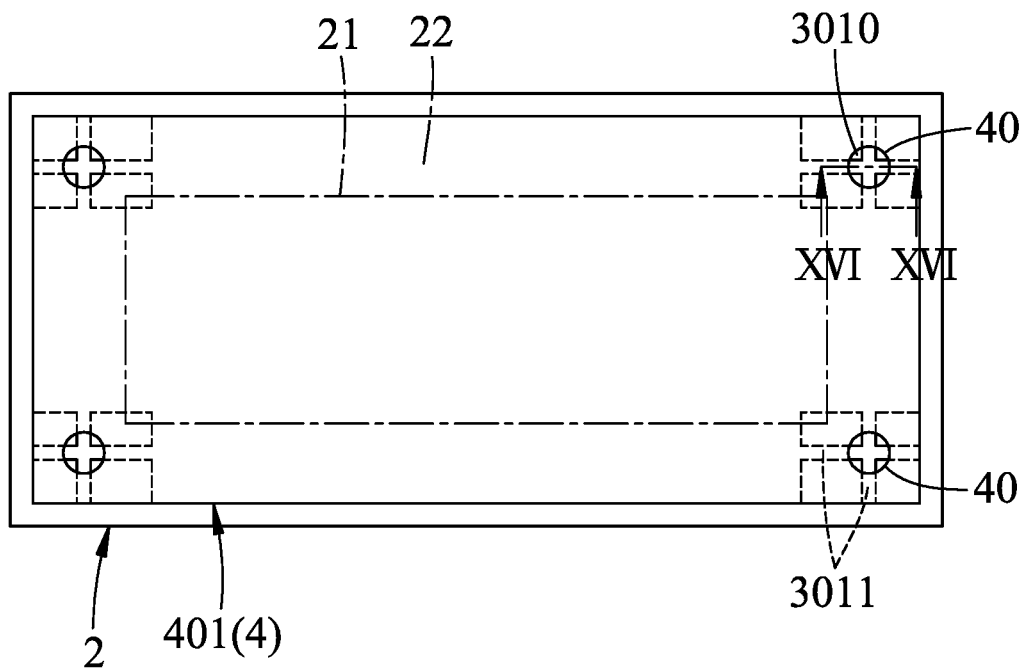
Figure 16:
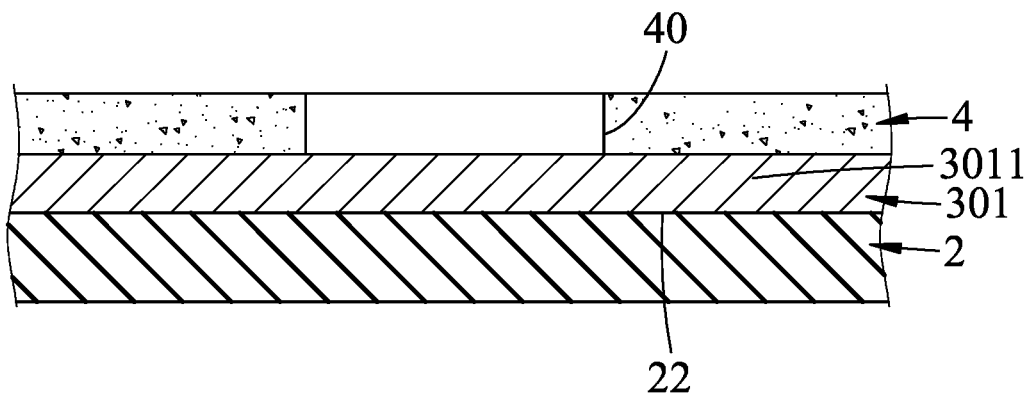
FIG. 16 is a cross-sectional view taken along line XVI-XVI of FIG. 15.

In step S3, as shown in FIGS. 15 and 16, the predetermined areas of the photoresist layer 401 at a position corresponding to a crisscross region of a respective one of the cross-shaped strips 3011 are subjected to the photolithography process, so as to form the through holes 40, each exposing the crisscross region of the respective one of the cross-shaped strips 3011.

Figure 17:
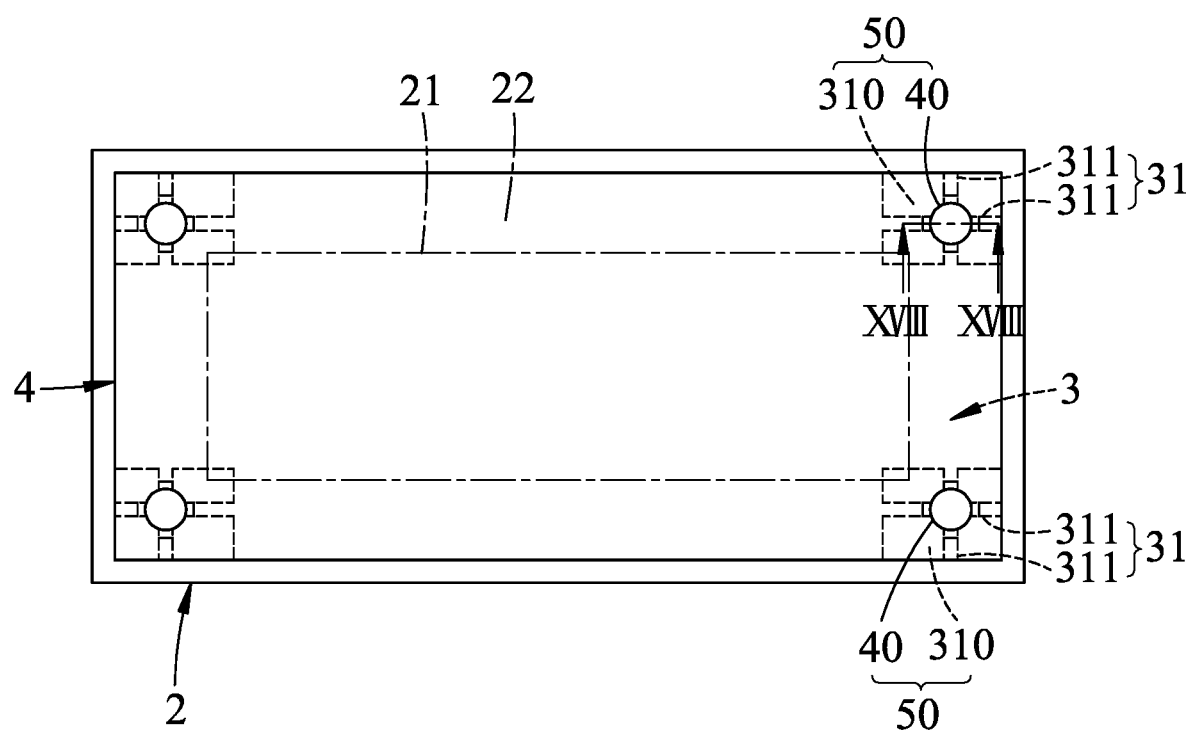
FIG. 17 is a schematic top view illustrating step S4 of the second embodiment of the packaging method.
Figure 18:
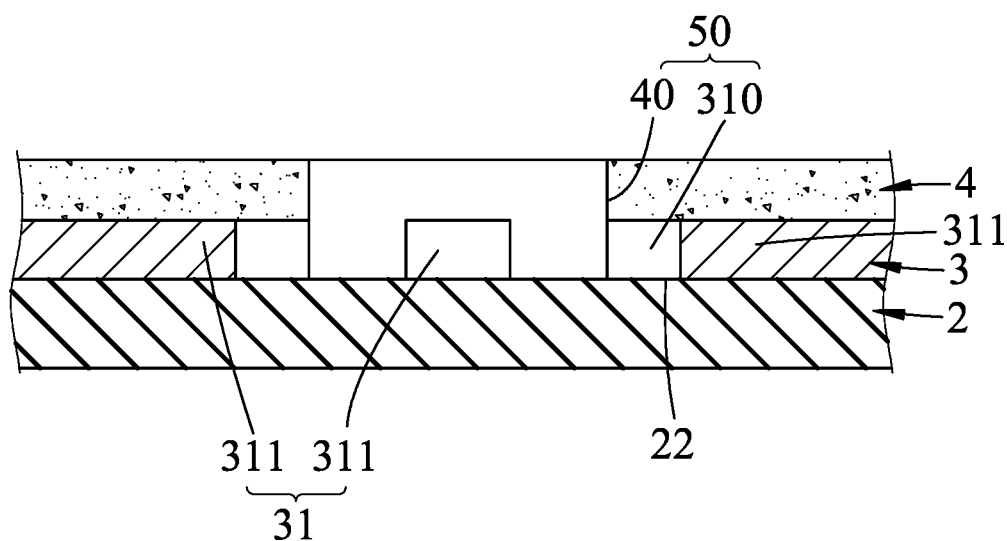
FIG. 18 is a cross-sectional view taken along line XVIII-XVIII of FIG. 17.

In step S4, as shown in FIGS. 17 and 18, the conductive layer 301 exposed from the through holes 40 is isotropically etched therefrom by an etchant, so as to form the protrusions 311 of the predetermined pattern that define the cavities 310, each of which cooperates with a respective one of the through holes 40 to form the accommodating space 50. Finally, in step S5, the accommodating space 50 is filled with the engaging elements 51 (each including the shank part 511 and the engaging parts 512 that radially extends from the shank part 511), so as to obtain the second embodiment of the semiconductor packaging structure (see FIGS. 12 and 13).

By virtue of forming the cross-shaped strip 3011 of the conductive layer 301 to expose the dummy region 22 of the substrate 2 in step S1, a covering area of the mask layer 4 on the exposed dummy region 2 can be increased, which is conducive for enhancing peeling resistance of the mask layer 4 in a lateral direction and for facilitating the subsequent isotropic etching process in step S4, thereby improving reproduction quality and stability of the semiconductor packaging structure.

Figure 19:
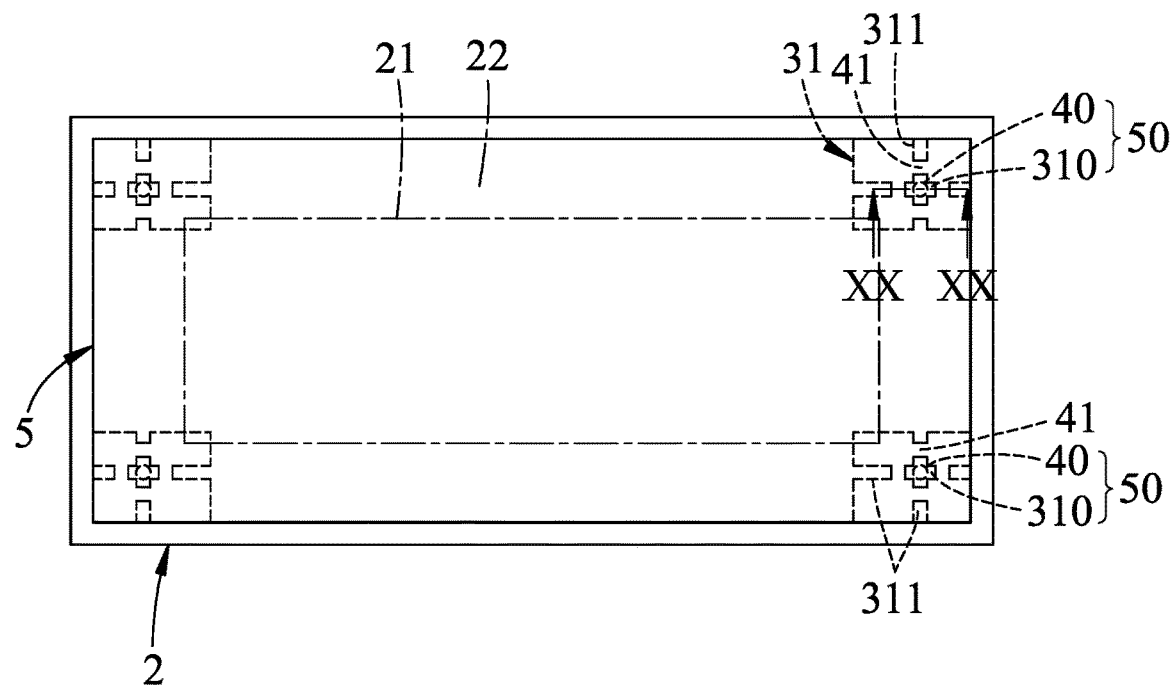
FIG. 19 is a schematic top view illustrating a third embodiment of the semiconductor packaging structure according to the disclosure.
Figure 20:
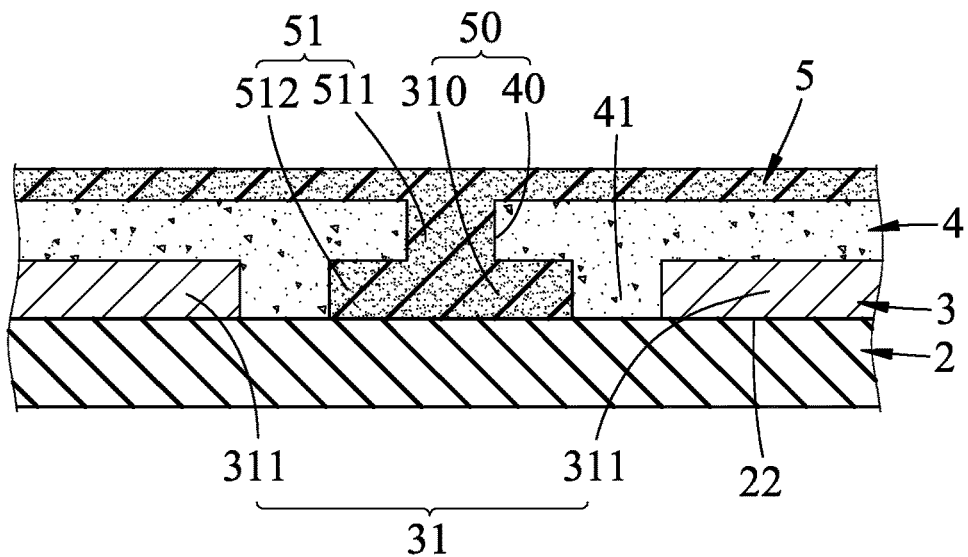
FIG. 20 is a cross-sectional view taken along line XX-XX of FIG. 19.

Referring to FIGS. 19 and 20, a third embodiment of the semiconductor packaging structure according to the present disclosure is generally similar to the second embodiment, except that in the third embodiment, the mask layer 4 includes a plurality of protruding portions 41 corresponding in number to the protrusions 311. Each of the protruding portions 41 protrudes toward the substrate 2 and surrounds a respective one of the protrusions 311. The protruding portions 41 and the protrusions 311 of the predetermined pattern 31 cooperate to define the cavities 310, each of which communicates in space with a respective one of the through holes 40 to form the accommodating space 50. In certain embodiments, the protruding portions 41 are in contact with the substrate 2. In other embodiments, the protruding portions 41 are in contact with the protrusions 311. In addition, for each of the engaging elements 51, the shank part 511 extends from the through hole 40 to the substrate 2, and the engaging parts 512 are in contact with the protruding portions 41.

Referring to FIGS. 21 to 25, a third embodiment of the packaging method for making the third embodiment of the semiconductor packaging structure according to the disclosure is generally similar to the second embodiment of the packaging method, except for the following differences.

Figure 21:
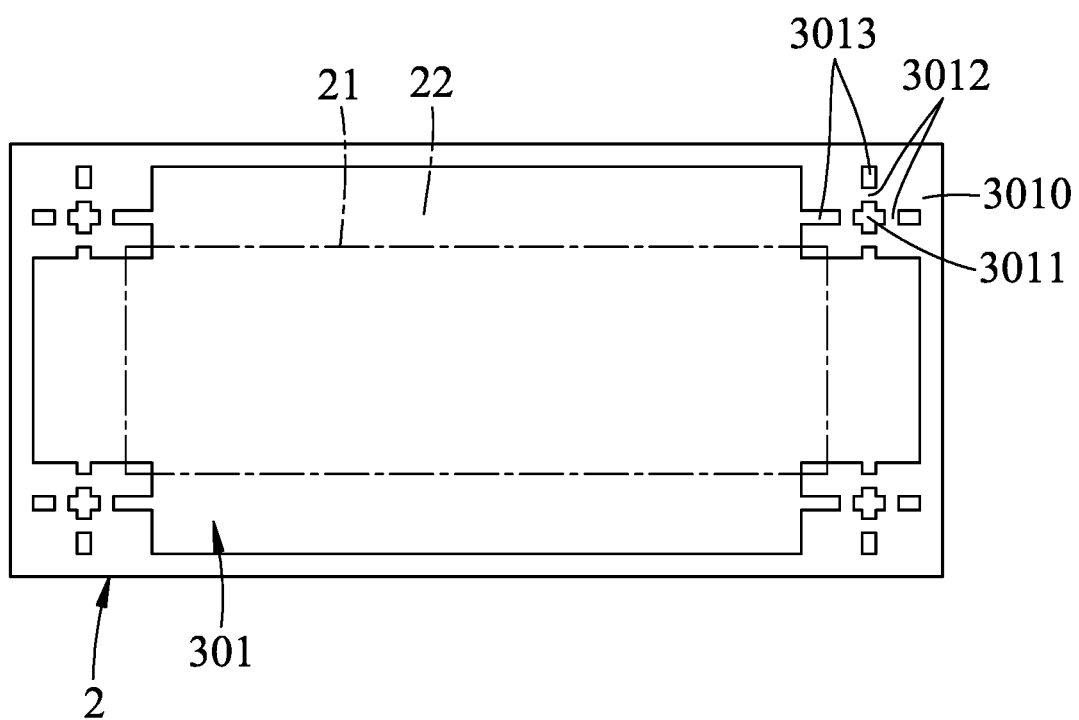
FIGS. 21 and 22 are schematic top views illustrating step S1 and S3 of a third embodiment of the packaging method for making the third embodiment of the semiconductor packaging structure.
Figure 22:
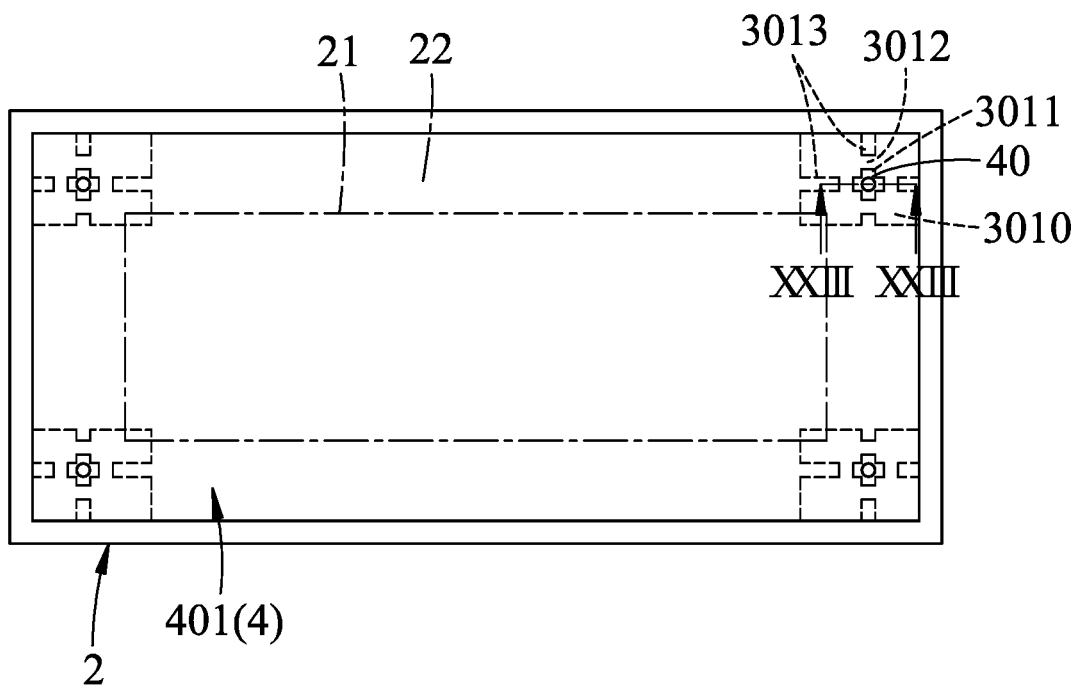
Figure 23:
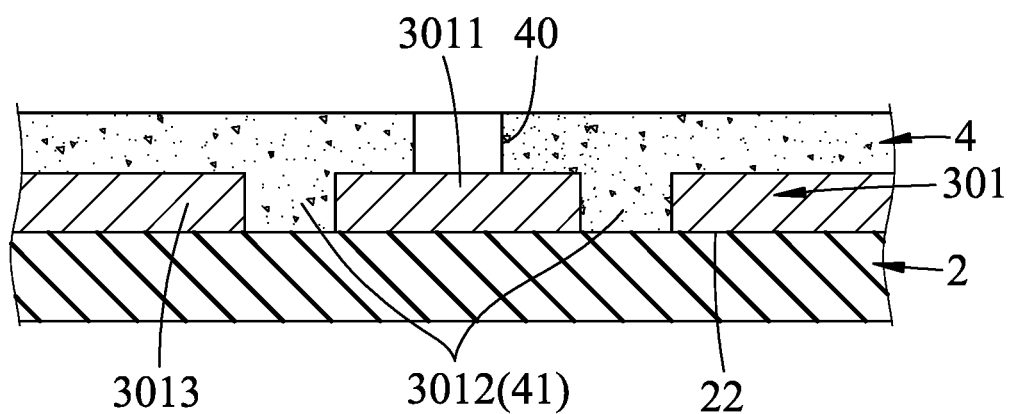
FIG. 23 is a cross-sectional view taken along line XXIII-XXIII of FIG. 22.
Figure 24:
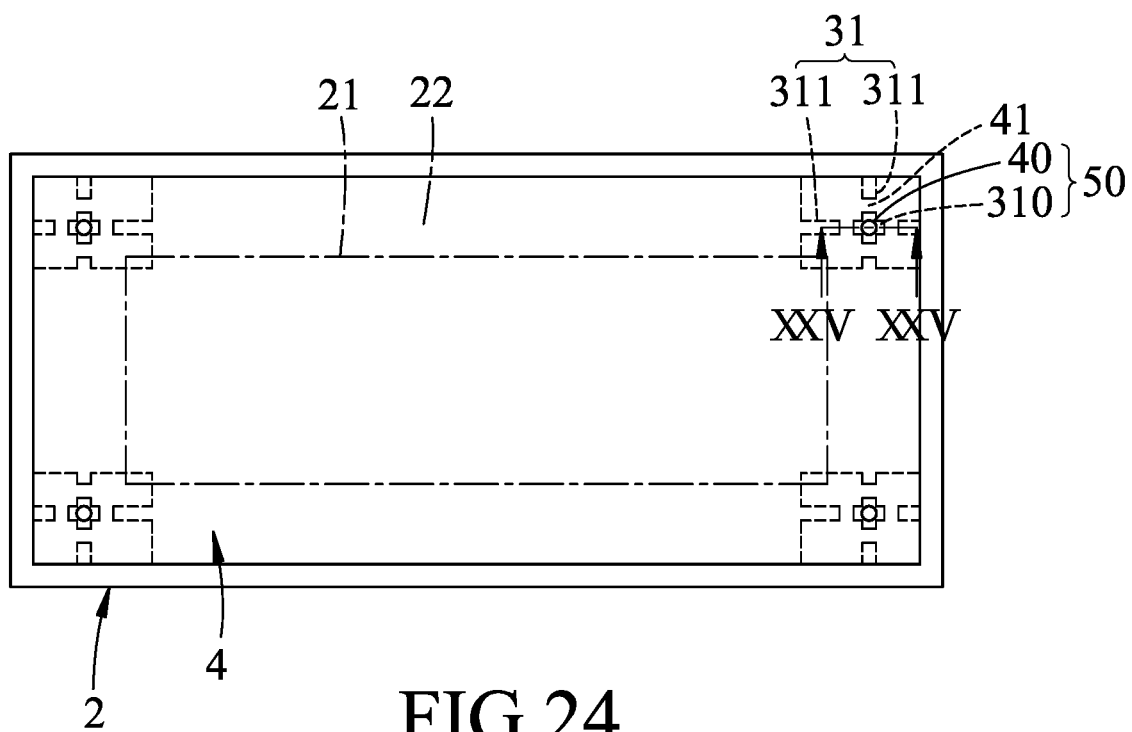
FIG. 24 is a schematic top view illustrating step S4 of the third embodiment of the packaging method.
Figure 25:
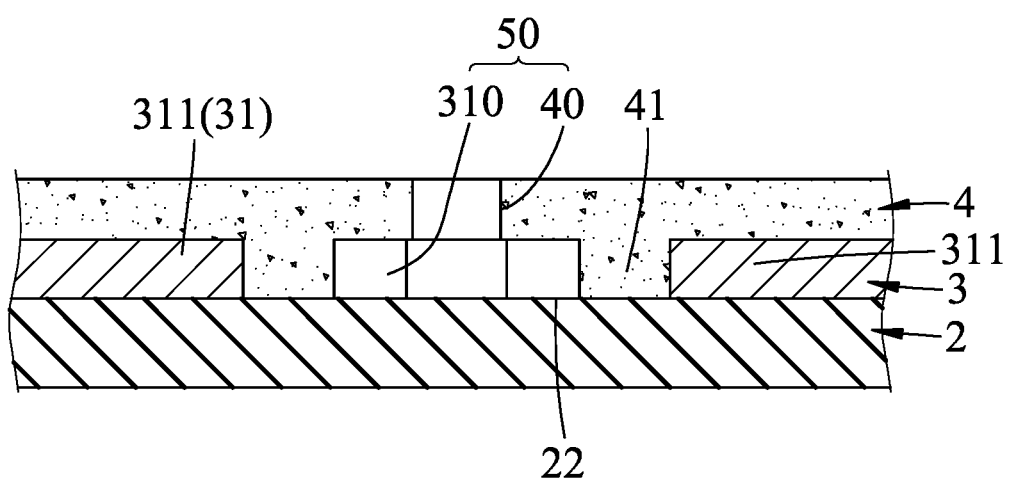
FIG. 25 is a cross-sectional view taken along line XXV-XXV of FIG. 24.

In step S1, as shown in FIG. 21, each of the first patterns of the conductive layer 301 further includes a plurality of strips 3013 that are spacedly disposed around the cross-shaped strip 3011. That is, each of the strips 3013 is spaced apart from the cross-shaped strip 3011 by a spacing 3012. The strips 3013 and the cross-shaped strip 3011 cooperate to define the recess region 3010. Then, as shown in FIGS. 22 and 23, in step S2, the photoresist layer 401 covers the conductive layer 301 and fills the recess regions 3010 and the spacing 3012, so as to form the protruding portions 41 enclosing the strips 3013 and the cross-shaped strips 3011. In step S3, the predetermined areas of the photoresist layer 401 at a position corresponding to a central region of a respective one of the cross-shaped strips 3011 are subjected to the photolithography process, so as to form the through holes 40, each exposing the central region of the respective one of the cross-shaped strips 3011. In step S4, as shown in FIGS. 24 and 25, the cross-shaped strips 3011 of the conductive layer 301 exposed from the through holes 40 are isotropically etched by an etchant, so as to form the protrusions 311 of the predetermined pattern 31 that define the cavities 310, each of which cooperates with a respective one of the through holes 40 to form the accommodating space 50. Finally, in step S5, the accommodating space 50 is filled with the engaging elements 51, so as to obtain the third embodiment of the semiconductor packaging structure (see FIGS. 19 and 20).

In addition to the advantages provided in the first embodiment of the packaging method, by virtue of forming the first patterns each including the cross-shaped strip 3011 and the strips 3013 separated from the cross-shaped strip 3011 by the spacing 3012 in step S1, the photoresist layer 401 can be filled in the spacing 3012 to form the protruding portions 41 that protrudes to the substrate 2, so that the covering area of the mask layer 4 on the dummy region 2 can be further increased as compared to the second embodiment, which effectively enhances the peeling resistance of the mask layer 4 in the lateral direction, and facilitates the subsequent isotropic etching process to be performed in step S4. Therefore, the third embodiment of the semiconductor packaging structure can be made with a relatively high reproduction quality and stability.

In sum, with the engaging element 51 of the sealing layer 5 which fills the accommodating space 50 that extends through the wiring layer 3 and the mask layer 4, and which securely adheres to the substrate 2, the semiconductor packaging structure of this disclosure can be made in a cost-saving manner, and exhibits an improved sealability.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A semiconductor packaging structure, comprising:
   a substrate which has an effective region and a dummy region surrounding said effective region;
   a wiring layer which is disposed on said effective region and said dummy region of said substrate, and which is formed with a predetermined pattern to expose a portion of said dummy region, said predetermined pattern including a plurality of protrusions that extend toward each other and that are spaced apart from each other to define at least one cavity;
   a mask layer which covers said wiring layer opposite to said substrate, and which is formed with at least one through hole to communicate in space with said cavity, said through hole having a size that is smaller than a size of said cavity, said through hole and said cavity cooperating to form an accommodating space; and
   a sealing layer which covers said mask layer and which includes an engaging element filling said accommodating space and adhering to said substrate,
   wherein said engaging element includes a shank part extending from said through hole to said substrate, and a plurality of engaging parts contacting with said protrusions, each of said engaging parts radially extending from said shank part.

2. The semiconductor packaging structure of claim 1, wherein said predetermined pattern defines a plurality of said cavities, and said mask layer is formed with a plurality of said through holes to respectively communicate in space with said cavities.

3. The semiconductor packaging structure of claim 2, wherein said cavities are spacedly located on a peripheral portion of said dummy region.

4. The semiconductor packaging structure of claim 2, wherein a difference between the size of each of said cavities and the size of a respective one of said through holes of said mask layer ranges from 50 μm to 100 μm.

5. The semiconductor packaging structure of claim 4, wherein the size of each of said through holes ranges from 100 μm to 500 μm.

6. The semiconductor packaging structure of claim 1, wherein said engaging element is in a shape of an inverted stud.

7. The semiconductor packaging structure of claim 1, wherein said mask layer includes a plurality of protruding portions corresponding in number to said protrusions, each of said protruding portions protruding toward said substrate and surrounding a respective one of said protrusions, said protruding portions cooperating with said predetermined pattern to define said cavity.

8. The semiconductor packaging structure of claim 7, wherein said protruding portions are in contact with said substrate.

9. The semiconductor packaging structure of claim 7, wherein said protruding portions are in contact with said protrusions.

10. A semiconductor packaging structure comprising:
    a substrate which has an effective region and a dummy region surrounding said effective region;
    a wiring layer which is disposed on said effective region and said dummy region of said substrate, and which is formed with a predetermined pattern to expose a portion of said dummy region, said predetermined pattern including a plurality of protrusions that extend toward each other and that are spaced apart from each other to define a plurality of cavities;
    a mask layer which covers said wiring layer opposite to said substrate, and which is formed with a plurality of through holes to respectively communicate in space with said cavities, each of said through holes having a size that is smaller than a size of a respective one of said cavities, said through holes and said cavities cooperating to form an accommodating space; and
    a sealing layer which covers said mask layer and which includes an engaging element filling said accommodating space and adhering to said substrate, and
    wherein a difference between the size of each of said cavities and the size of the respective one of said through holes of said mask layer ranges from 50 μm to 100 μm.

11. The semiconductor packaging structure of claim 10, wherein said cavities are spacedly located on a peripheral portion of said dummy region.

12. The semiconductor packaging structure of claim 10, wherein said engaging element is in a shape of an inverted stud.

13. The semiconductor packaging structure of claim 10, wherein the size of each of said through holes ranges from 100 μm to 500 μm.

14. A semiconductor packaging structure comprising:
    a substrate which has an effective region and a dummy region surrounding said effective region;
    a wiring layer which is disposed on said effective region and said dummy region of said substrate, and which is formed with a predetermined pattern to expose a portion of said dummy region, said predetermined pattern including a plurality of protrusions that extend toward each other and that are spaced apart from each other to define at least one cavity;
    a mask layer which covers said wiring layer opposite to said substrate, and which is formed with at least one through hole to communicate in space with said cavity, said through hole having a size that is smaller than a size of said cavity, said through hole and said cavity cooperating to form an accommodating space; and a sealing layer which covers said mask layer and which includes an engaging element filling said accommodating space and adhering to said substrate, wherein said mask layer includes a plurality of protruding portions corresponding in number to said protrusions, each of said protruding portions protruding toward said substrate and surrounding a respective one of said protrusions, said protruding portions cooperating with said predetermined pattern to define said cavity.

15. The semiconductor packaging structure of claim 14, wherein said predetermined pattern defines a plurality of said cavities, and said mask layer is formed with a plurality of said through holes to respectively communicate in space with said cavities.

16. The semiconductor packaging structure of claim 15, wherein said cavities are spacedly located on a peripheral portion of said dummy region.

17. The semiconductor packaging structure of claim 15, wherein a difference between the size of each of said cavities and the size of a respective one of said through holes of said mask layer ranges from 50 µm to 100 µm.

18. The semiconductor packaging structure of claim 14, wherein said engaging element is in a shape of an inverted stud.

19. The semiconductor packaging structure of claim 14, wherein said protruding portions are in contact with said substrate.

20. The semiconductor packaging structure of claim 14, wherein said protruding portions are in contact with said protrusions.

* * * * *